United States Patent [19]

Tomioka

[11] Patent Number: 5,754,464
[45] Date of Patent: May 19, 1998

[54] MASK ROM WITH FIELD SHIELD TRANSISTORS FUNCTIONING AS MEMORY CELLS AND METHOD OF READING DATA THEREOF

[75] Inventor: Yugo Tomioka, Tateyama, Japan

[73] Assignee: Nippon Steel Semiconductor Corporation, Chiba, Japan

[21] Appl. No.: 766,505

[22] Filed: Dec. 13, 1996

[30] Foreign Application Priority Data

Dec. 27, 1995 [JP] Japan .................... 7-352024

[51] Int. Cl.$^6$ .................................... G11C 17/10
[52] U.S. Cl. ...................... 365/104; 365/178; 257/390
[58] Field of Search ........................ 365/104, 178; 257/390

[56] References Cited

U.S. PATENT DOCUMENTS 5,594,684  1/1997  Hsue ........................ 365/185.01

*Primary Examiner*—David C. Nelms
*Assistant Examiner*—Andrew Q. Tran
*Attorney, Agent, or Firm*—Holland & Hart LLP

[57] ABSTRACT

A mask ROM with increased memory capacity is disclosed. Besides MOS transistors each comprising a memory cell, MOS field shield transistors for device isolation, originally provided for electrically isolating the memory cell transistors, are also used as additional memory cells in addition to providing their isolating function. To write data in one of the field shield transistor, the threshold voltage of the field shield transistor is lowered, compared to field shield transistors in other regions. This is done by ion implantation of an n-type impurity into a p-type silicon substrate in a region beneath a gate electrode of the field shield transistor (a channel region). Data is read by judging on/off of the transistors when an intermediate voltage, between a high threshold voltage and a low threshold voltage is applied to a field shield line.

8 Claims, 13 Drawing Sheets

A-A' cross section

B-B' cross section

C-C' cross section

D-D' cross section

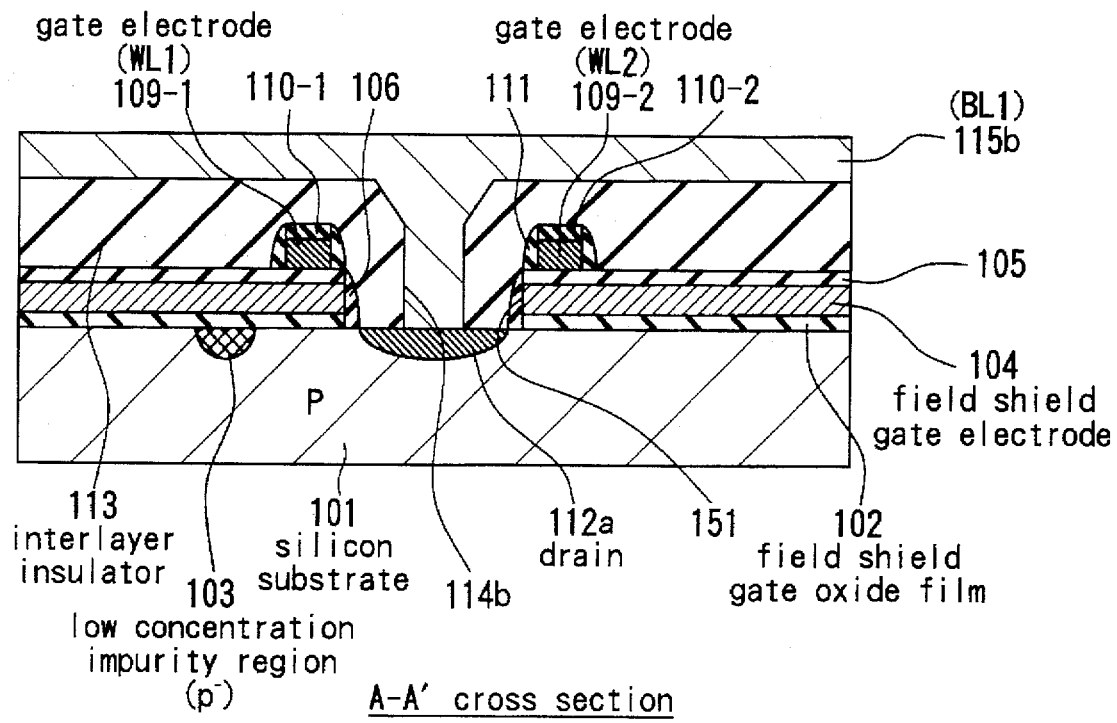
FIG.9 A-A' cross section
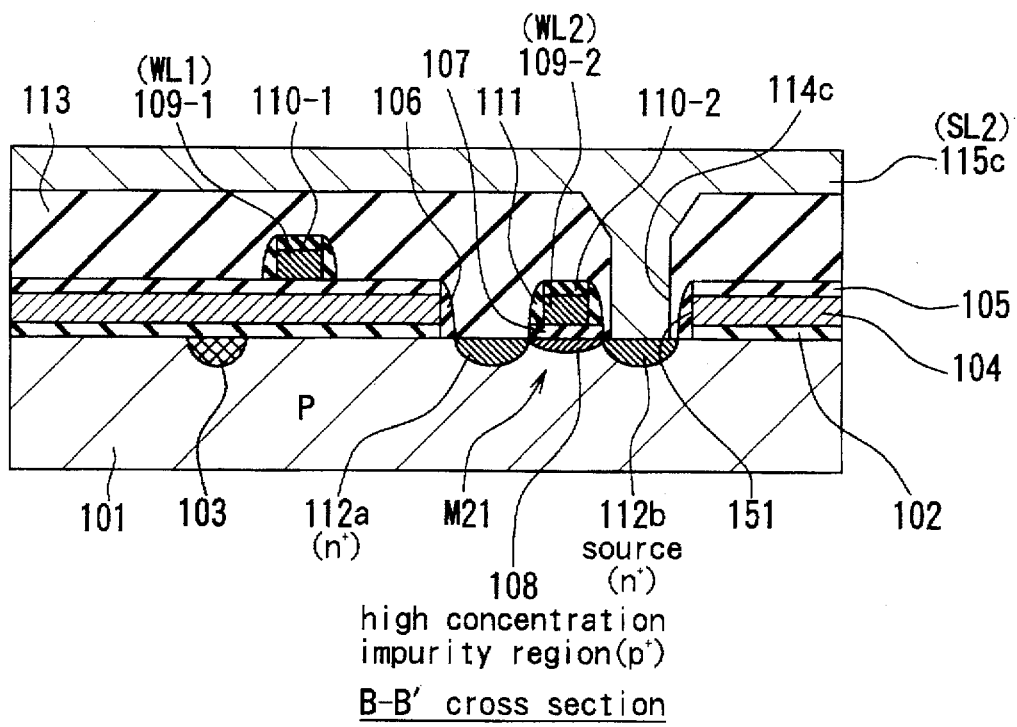
FIG.10 B-B' cross section

C-C' cross section

D-D' cross section

E-E' cross section

F-F' cross section 103 low concentration impurity region (p⁻)   101 silicon substrate   102' silicon dioxide film 106   151   105
104 field shield gate electrode
103   101   102 field shield gate oxide film 106   107'   122
105
104
103   101   108 high concentration impurity region (p⁺)   151   102

MASK ROM WITH FIELD SHIELD TRANSISTORS FUNCTIONING AS MEMORY CELLS AND METHOD OF READING DATA THEREOF

FIELD OF THE INVENTION

The present invention relates to a mask read only memory (ROM) wherein data is written during manufacturing and a method of manufacturing same. The present invention also relates to a method of reading data from a mask ROM. The invention particularly relates to a mask ROM with field shield isolation structure.

BACKGROUND OF THE INVENTION

Some mask ROMs have a field shield device isolation structure. The structure isolates devices by selectively forming a MOS field shield transistor between MOS transistors each comprising a memory cell and fixing the potential of the gate electrode of the field shield transistor below the threshold voltage thereof. A conventional mask ROM is described below with reference to FIGS. 1 to 6.

FIG. 1 shows the circuit of memory cells of a conventional mask ROM. FIG. 2 is a plan view showing the configuration of the device shown in FIG. 1. FIG. 3 is a cross section taken along line A-A' of FIG. 2. FIG. 4 is a cross section taken along line B-B' of FIG. 2. FIG. 5 is a cross section taken along line C-C' of FIG. 2. FIG. 6 is a cross section taken along line D-D' of FIG. 2.

As shown in FIG. 1, the mask ROM has NMOS transistors M11 to M22, each functioning as a memory cell. Of these transistors, a gate electrode of each transistor M11 and M12 is connected to a word line WL1. A gate electrode of each transistor M21 and M22 is connected to a word line WL2. Drains of transistors M11 and M21 are connected to each other as well as to a bit line BL1. Drains of transistors M12 and M22 are connected to each other as well as to a bit line BL2. Each of source lines SL1 to SL4 of the four transistors is grounded.

As shown in FIGS. 2 to 6, a field shield gate electrode 104 is formed over the entire surface of the region where a memory cell is formed in a p-type silicon substrate 101, via a field shield gate oxide film 102. A field shield cap oxide film 105 is formed over the entire surface of field shield gate electrode 104. Openings 151 and 152 of a reversed long and narrow S shape are selectively formed, penetrating these three layers to reach silicon substrate 101. Sidewall oxide films 106 are formed at the inner side of openings 151 and 152. As described below, field shield gate electrode 104 comprises a field shield transistor for device isolation to isolate memory cell transistors from each other.

On field shield cap oxide film 105 and silicon substrate 101 inside openings 151 and 152, a gate electrode layer 109-1, a cap oxide film 110-1, a gate electrode layer 109-2 and a cap oxide film 110-2 are extended, each patterned in a linear manner (in the vertical direction of FIG. 2). In the region inside openings 151 and 152, gate electrodes 109-1 and 109-2 are formed via a gate oxide film 107. Gate electrode 109-1 functions as word line WL1 of transistors M11 and M12. Gate electrode 109-2 functions as word line WL2 of transistors M21 and M22. A sidewall oxide film 111 is formed at both sides of gate electrode layer 109-1, cap oxide film 110-1, gate electrode layer 109-2 and cap oxide film 110-2.

As shown in FIGS. 2 and 3, a diffused drain layer 112a and a diffused source layer 112b are formed in a self-aligned manner with sidewall oxide films 106 and 111, in proximity to the surface of silicon substrate 101 inside opening 151. These diffused layers are formed by diffusing an n-type impurity in silicon substrate 101 to form regions for the drain and source of transistor M21. Though cross-sectional figures corresponding to FIG. 4 are not shown, transistors M11, M12 and M22 have the same structure as transistor M21.

An interlayer insulator 113 of a boron phosphorous silicate glass (BPSG) film or the like is formed over the entire surface to cover the devices described above. Contact holes 114b and 114c are formed, penetrating interlayer insulator 113 to reach diffused drain layer 112a and diffused source layer 112b inside opening 151. Metal wirings 115b and 115c, patterned in a linear manner, are formed to fill in the contact holes, extended to intersect at a right angle to gate electrode layers 109-1 and 109-2 (FIGS. 2 to 4). Metal wirings 115b function as bit lines BL1 and BL2. Metal wirings 115c function as source lines SL1 to SL4. Such metal wirings are made of aluminum and the like. Metal wirings 115a, 115b and 115c are covered with a protective film (not shown).

As shown in FIG. 2, field shield gate electrode 104 is connected via contact holes 114a to metal wiring 115a extending parallel to metal wirings 115b and 115c. Metal wiring 115a is normally fixed to 0V. Here, the threshold voltage of a field shield transistor for device isolation is, for example, 3V, wherein field shield gate electrode 104 is a gate electrode of the field shield transistor for device isolation. Therefore, field shield gate electrode 104 is fixed to 0V to keep the field shield transistor for device isolation nonconducting to electrically isolate adjacent transistors M11 to M22 from each other.

The operation of the mask ROM configured as above, includes the writing of data in the mask ROM during manufacture by ion implantation of an impurity into the surface of silicon substrate 101 only in the region to be a channel region of a memory cell transistor with a masking except for that region, through which the threshold voltage of the memory cell transistor is changed. For instance, data is to be written into memory cell transistor M21 when the threshold voltage of transistors M11 to M22 is 1V in an initial state (e.g., when data is not written). During manufacture, as shown in FIG. 4, a high concentration impurity region 108 is formed by ion implantation of a p-type impurity into silicon substrate 101 beneath gate electrode layer 109-2 of transistor M21 so as to change the threshold voltage to 2V only of transistor M21. The threshold voltage of the other transistors M11, M12 and M22 remains 1V.

Data is read from the mask ROM manufactured as described above, by judging data '0' or '1' corresponding to on/off of the memory cell to be read, or the presence or absence of a drain current, when the bit line of the memory cell transistor to be read is raised and a voltage is applied to the word line of the memory cell transistor. The applied voltage is the middle of a high threshold voltage (of the memory cell transistor wherein data is written) and a low threshold voltage (of the memory cell transistor wherein data is not written).

In FIG. 1, for example, bit line BL1 is set to 5V, bit line BL2 is set to 0V, word line WL1 is set to 1.5V and word line WL2 is set to 0V, to read data from memory cell transistor M11 in which data is not written. Source lines SL1 and SL2 are grounded to be 0V. In this situation, the threshold voltage of transistor M11 is 1V so that transistor M11 turns on to allow a current to flow from bit line BL1 to source line SL1.

On the other hand, to read data from memory cell transistor M21 in which data is written, bit line BL1 is set to 5V, bit line BL2 is set to 0V, word line WL1 is set to 0V and word line WL2 is set to 1.5V. Source lines SL1 and SL2 are set to 0V as the case described above. In this situation, the threshold voltage of transistor M21 is 2V so that transistor M21 turns off and does not allow a current to flow from bit line BL1 to source line SL2. The presence or absence of a drain current is thus judged and associated with data '0' or '1' to be read.

Memory cell transistors M11 to M22 are electrically isolated from each other to allow data reading from each of the memory cells as described above. The memory cells are isolated by fixing field shield gate electrode 104 to 0V and thus below the threshold voltage so as to keep the field shield transistor nonconducting.

As thus described, the mask ROM has memory cells each comprising a single MOS transistor. This relatively simple structure provides relatively high integration.

In recent years, however, even more highly integrated semiconductor memories such as a DRAM are necessary to meet a demand for larger memory capacity as well as a smaller chip size. A highly integrated mask ROM is also needed for a smaller chip size and larger memory capacity. A chip's overall size depends on the size of a memory cell transistor in the chip and the size of a field shield MOS transistor for device isolation in the chip when the amount of memory is the same. In other words, the amount of memory depends on the size of a memory cell transistor and the size of a field shield MOS transistor for device isolation when the chip size is the same. Therefore, higher microstructuring techniques are required for a smaller mask ROM with larger memory capacity, which often creates accompanying difficulties.

SUMMARY OF THE INVENTION

The present invention is designed to solve the problem described above. It is an objective of the invention to provide a higher density mask ROM, provide a method of reading data therefrom and provide a method of manufacturing a mask ROM to achieve a smaller chip size as well as larger memory capacity with the present level of microstructuring techniques.

More particularly, the mask ROM of the present invention provides field shield device isolation, and comprises: MOS transistors for memory cells formed on a semiconductor substrate, storing data when a threshold voltage thereof is changed; and MOS field shield transistors for device isolation, dividing, i.e. separating each of the MOS transistors forming memory cells from each other so into electrically isolated divisions. In addition, MOS transistors, each functioning as a memory cell for storing data, are formed in part of a device isolation region between the divisions by changing a threshold voltage of part of a channel region of the MOS field shield transistors utilized for device isolation.

In other words, in this mask ROM, besides the MOS transistor for a memory cell used for data storage as an original memory cell, part of the MOS field shield transistor originally provided for device isolation also has a function as a memory cell, of storing data. That is, the threshold voltage of part of the channel region of the MOS field shield transistor for device isolation is changed to provide a MOS field shield transistor with the region for its channel functioning as a memory cell to store data.

The mask ROM of the present invention is configured to have part of the channel region for connecting a source and a drain of a MOS transistor for a memory cell in one division and a source and a drain of a MOS transistor for a memory cell in another division.

In the mask ROM, a threshold voltage is changed, of the channel region between the source (or the drain) of the MOS transistor for a memory cell in the one division and the source (or the drain) of the other MOS transistor for a memory cell in the other division. As a result, the MOS field shield transistor with that region for its channel functions as a memory cell to store data.

The mask ROM of the invention further comprises: a means for applying an intermediate voltage between different threshold voltages of the MOS field shield transistors for device isolation, to a field shield gate electrode of the MOS field shield transistor for device isolation; a means for allowing the MOS transistor for a memory cell in one division as well as the MOS transistor for a memory cell in another division to be conducting; and a means for allowing both source lines of the conducting MOS transistors to be floating.

The mask ROM of the present invention allows data to be read from the MOS field shield transistor having as its channel region between the source (or the drain) of the MOS transistor for a memory cell in the one division and the source (or the drain) of MOS transistor for a memory cell in the other division. This read function is carried out by applying an intermediate voltage to the field shield gate electrode of the MOS field shield transistor for device isolation when the MOS transistor for a memory cell in the one division and the MOS transistor for a memory cell in the other division are both conducting while the source lines of these conducting MOS transistors for memory cells are floating. Here, the intermediate voltage is the voltage between at least two different threshold voltages of MOS field shield transistors for device isolation.

A method of reading data from the mask ROM in accordance with the invention includes: floating selected source lines of MOS transistors for memory cells; keeping a MOS transistor for a memory cell in a selected division and a MOS transistor for a memory cell in another selected division in a conducting state; applying an intermediate voltage between different threshold voltages of the MOS transistors for device isolation, to a field shield gate electrode of the MOS field shield transistor for device isolation; and detecting a current flowing from the drain to the source of the MOS transistor for a memory cell in the division, then through the MOS field shield gate electrode thereof, and the source to drain of the MOS transistor for a memory cell in the other division.

Thus the method of reading data from the mask ROM is to have the selected source lines of MOS transistors for memory cells floating and to have the MOS transistor for a memory cell in the one selected division and the MOS transistor for a memory cell in the other selected division conducting, and to apply the intermediate voltage to the field shield gate electrode of the MOS field shield transistor for device isolation. Accordingly, a current is detected flowing from the drain of the MOS transistor for a memory cell in the one division to the drain of the MOS transistor for a memory cell in the other division via the MOS field shield transistor for device isolation. The presence or the absence of the current corresponds to read data. Here, the intermediate voltage is the voltage between at least two different threshold voltages of MOS field shield transistors for device isolation.

A method of manufacturing the mask ROM of the invention includes: a step of forming a first insulating film over a semiconductor substrate; a step of selectively doping an impurity in part of said channel region to change a threshold voltage of a MOS field shield transistor for device isolation whose channel is the part of said channel region; a step of forming a first conductive film and a second insulating film in this order, over the entire surface to be patterned to form a MOS field shield transistor for device isolation; a step of forming a third insulting film to be patterned to form a first sidewall covering sides of the first conductive film and the second insulating film both of which are patterned; a step of forming a fourth insulating film in an active region divided by the MOS field shield transistor for device isolation; a step of selectively doping an impurity in a channel region of a MOS transistor for a memory cell to change a threshold voltage of the MOS transistor for the memory cell; a step of forming a second conductive film and a fifth insulating film in this order, over the entire surface to be patterned to form a MOS transistor for a memory cell; and a step of forming a sixth insulating film to be processed to form a second side wall covering sides of the second conductive film and the fifth insulating film both of which are patterned.

The method of writing data during manufacture of the mask ROM is to selectively dope an impurity in the channel region of the memory cell MOS transistor to change the threshold voltage thereof. At the same time, an impurity is selectively doped in part of the channel region of the device isolation MOS field shield transistor to change the threshold voltage of the MOS field shield transistor having that region as its channel. Thus, a data is written to the MOS field shield transistor.

As thus described, in the mask ROM of the invention, besides the MOS transistor for a memory cell used for an original memory cell for data storage, the MOS field shield transistor also functions as a memory cell for data storage by changing the threshold voltage of part of the region of the MOS field shield transistor originally provided for device isolation. As a result, the region of MOS field shield transistors for device isolation occupying a large area in a chip can be effectively used for data storage. The memory capacity of the chip is thus almost doubled with microstructuring techniques no higher than conventional techniques.

BRIEF DESCRIPTION OF THE DRAWINGS

FIG. 9 is a cross section showing the device configuration of the memory cell array of FIG. 8.

FIG. 10 is another cross section showing the device configuration of the memory cell array of FIG. 8.

DESCRIPTION OF THE PREFERRED EMBODIMENT

A preferred embodiment of the present invention will now be described in detail with reference to the accompanying drawings.

Figure 5:
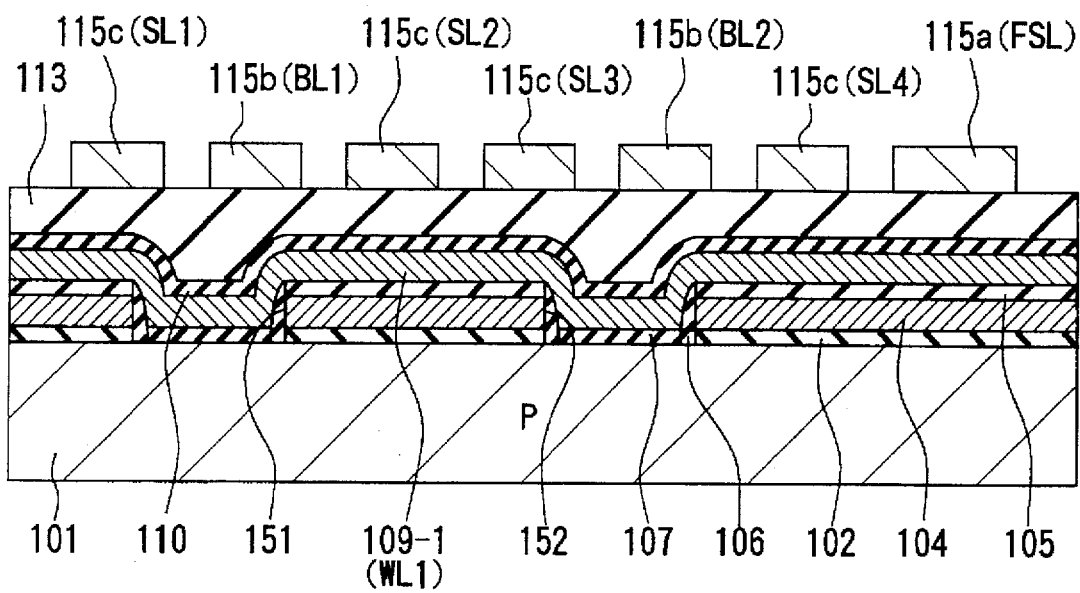
FIG. 5 is another cross section showing the device configuration of the memory cell array of FIG. 2.
Figure 6:
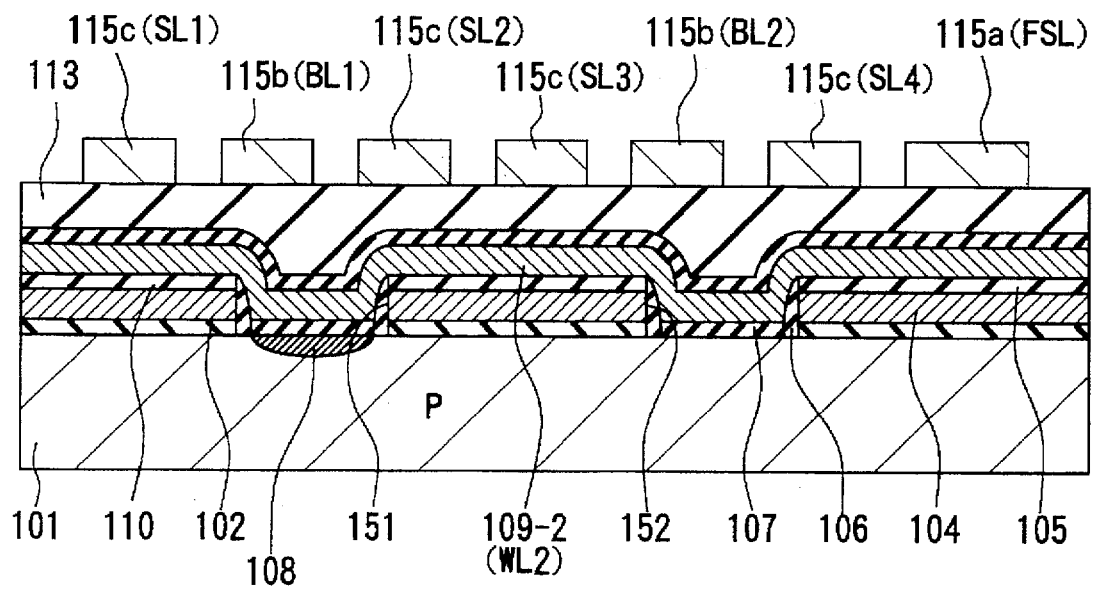
FIG. 6 is another cross section showing the device configuration of the memory cell array of FIG. 2.
Figure 7:
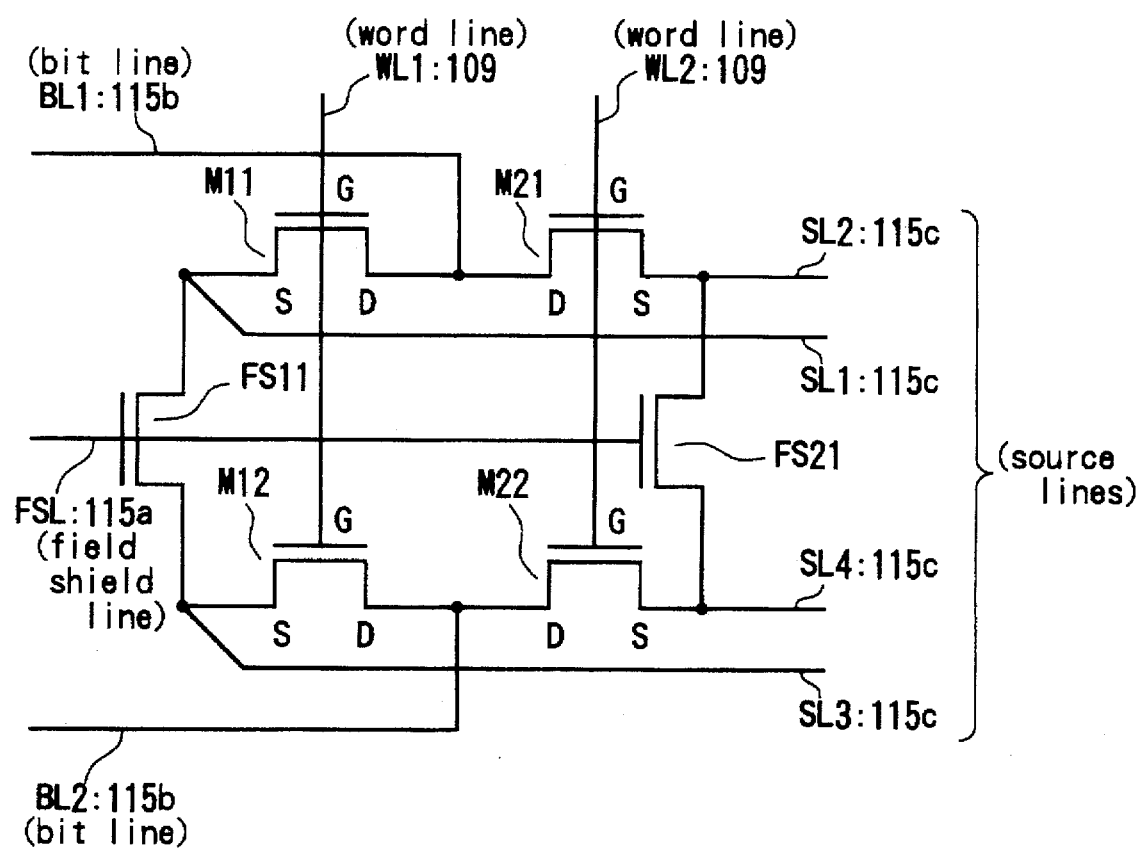
FIG. 7 is a circuit diagram showing part of a memory cell array of a mask ROM relating to an embodiment of the invention.
Figure 8:
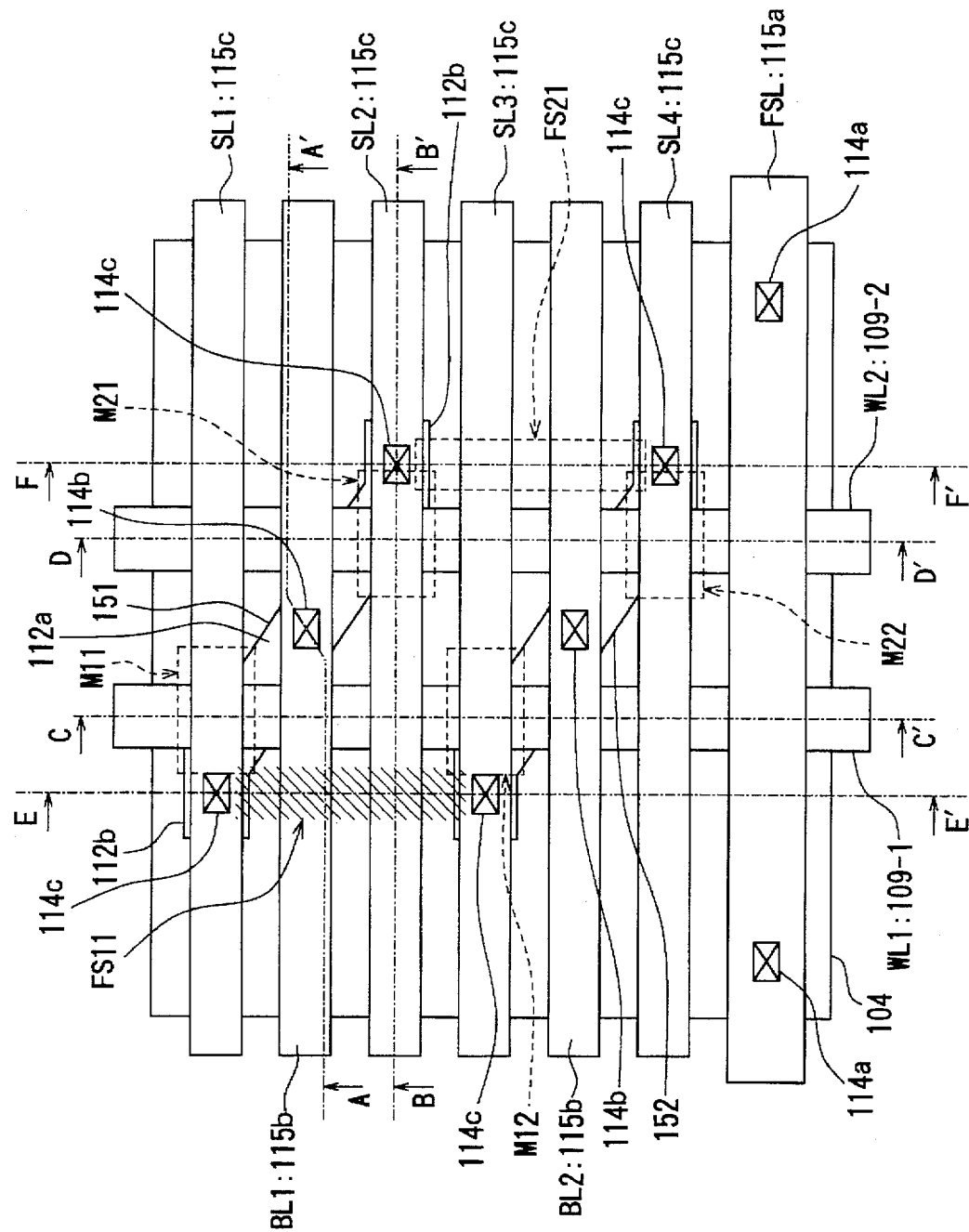
FIG. 8 is a plan view showing the device configuration of the memory cell array of the mask ROM.
Figure 11:
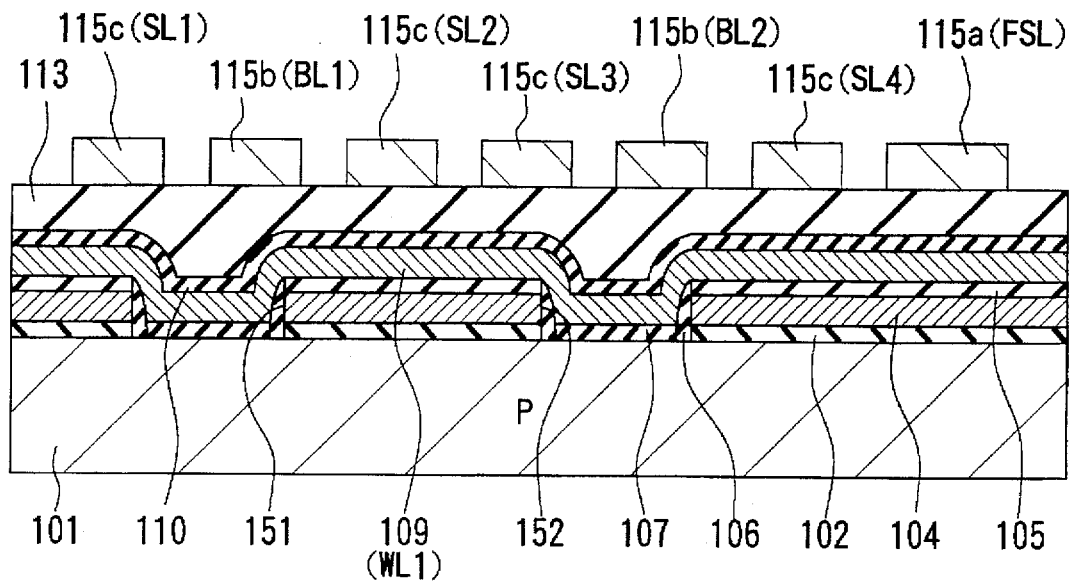
FIG. 11 is another cross section showing the device configuration of the memory cell array of FIG. 8.
Figure 12:
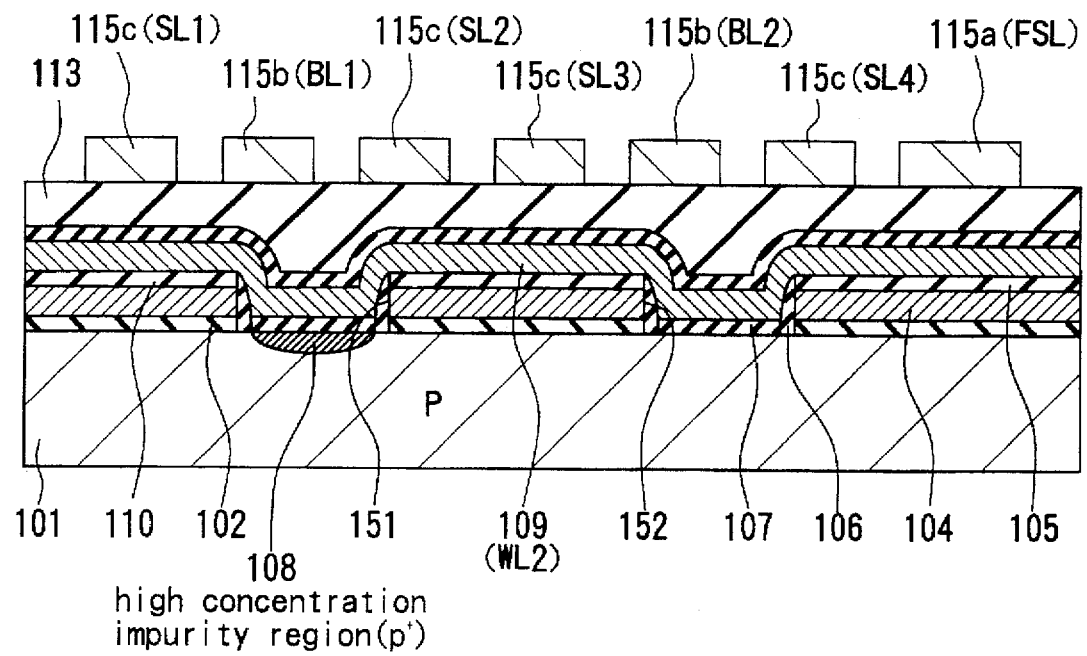
FIG. 12 is another cross section showing the device configuration of the memory cell array of FIG. 8.
Figure 13:
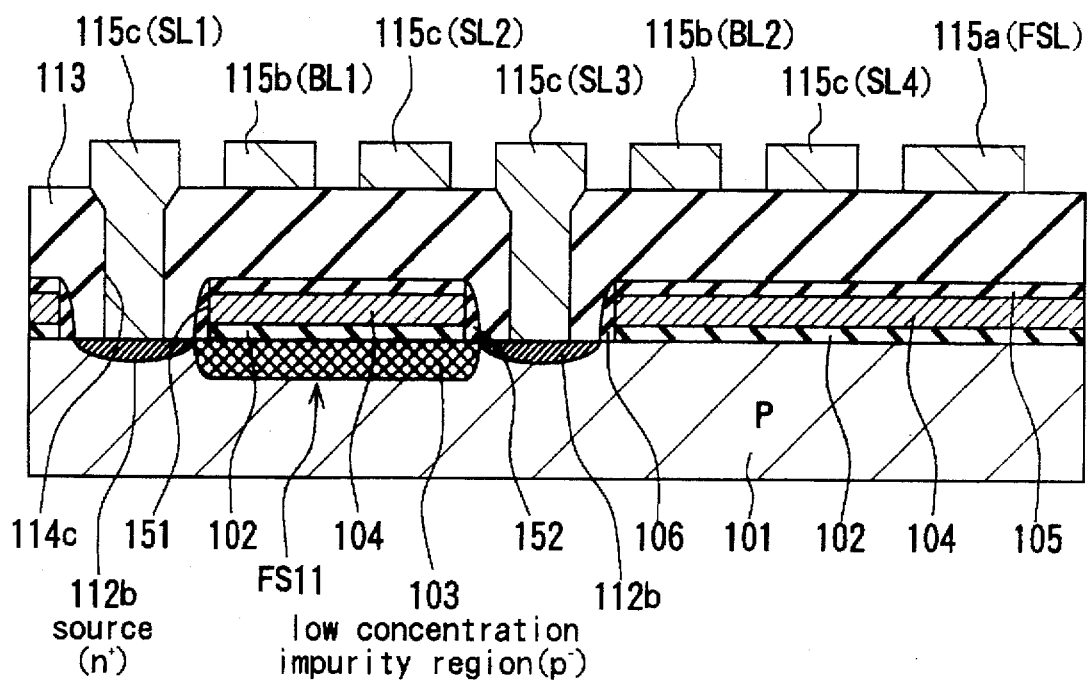
FIG. 13 is another cross section showing the device configuration of the memory cell array of FIG. 8.
Figure 14:
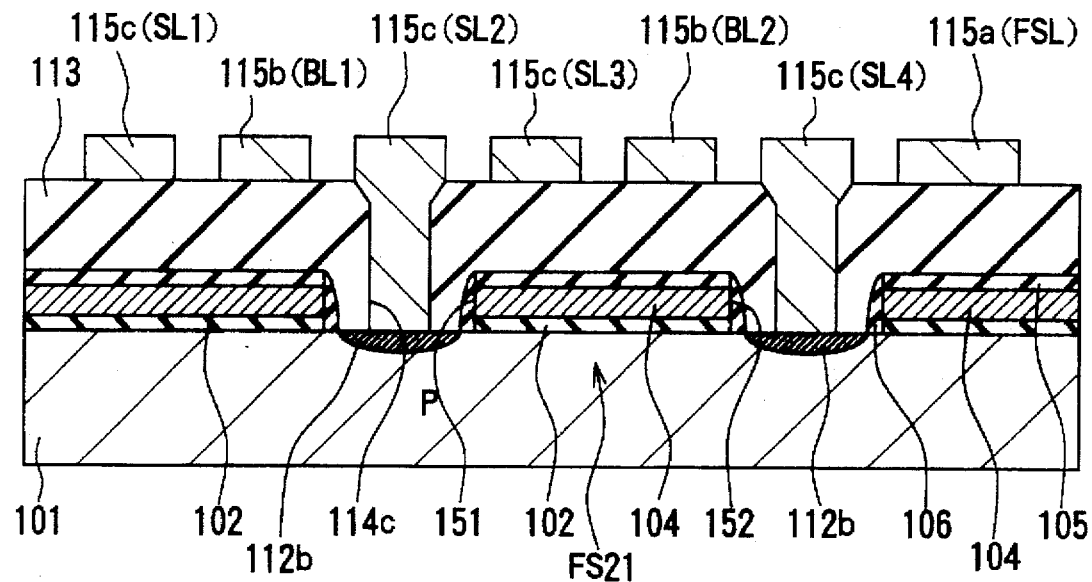
FIG. 14 is another cross section showing the device configuration of the memory cell array of FIG. 8.

FIG. 7 shows a circuit configuration of part of a memory cell array of a mask ROM relating to the preferred embodiment of the invention. FIG. 8 is a plan view thereof. FIG. 9 is a cross section taken along line A-A' of FIG. 8. FIG. 10 is a cross section taken along line B-B' of FIG. 8. FIG. 11 is a cross section taken along line C-C' of FIG. 8. FIG. 12 is a cross section taken along line D-D' of FIG. 8. FIG. 13 is a cross section taken along line E-E' of FIG. 8. FIG. 14 is a cross section taken along line F-F' of FIG. 8. For these figures, like numerals are applied to like components in FIGS. 1 to 6 showing the prior art.

As shown in FIG. 7, the mask ROM comprises NMOS transistors M11 to M22, each functioning as a memory cell. Each gate electrode of transistors M11 and M12 is connected to a word line WL1. Each gate electrode of transistors M21 and M22 is connected to a word line WL2. The drains of transistors M11 and M21 are connected to each other to be connected to a bit line BL1. The drain of transistors M12 and M22 are connected to each other to be connected to a bit line BL2. A field shield transistor FS11 is connected between the source of transistor M11 and the source of transistor M12. A field shield transistor FS21 is connected between the source of transistor M21 and the source of transistor M22. The connection between transistor M11 and field shield transistor FS11 is coupled to a source line SL1. The connection between transistor M21 and field shield transistor FS21 is coupled to a source line SL2. The connection between transistor M12 and field shield transistor FS11 is coupled to a source line SL3. The connection between transistor M22 and field shield transistor FS21 is coupled to a source line SL4. Each gate electrode of field shield transistors FS11 and FS21 is coupled to a field shield line FSL.

As shown in FIGS. 8 to 14, a field shield gate electrode 104 is formed over the entire surface in the region where a memory cell is formed in a p-type substrate 101, via a field shield gate oxide film 102. A field shield cap oxide film 105 is further formed over the entire surface of field shield gate electrode 104. Openings 151 and 152 of a reversed long and narrow S shape are selectively formed, penetrating these three layers to reach silicon substrate 101. Sidewall oxide films 106 are formed at the inner sides of openings 151 and 152. The field shield gate electrode 104 comprises a field shield transistor for device isolation to isolate memory cell transistors from each other.

On field shield cap oxide film 105 and silicon substrate 101 inside openings 151 and 152, a gate electrode layer 109-1, a cap oxide film 110-1, a gate electrode layer 109-2 and a cap oxide film 110-2 are extended, each patterned in a linear manner (in the vertical direction of FIG. 8). In the region inside openings 151 and 152, gate electrodes 109-1 and 109-2 are formed via a gate oxide film 107. Gate electrode 109-1 functions as word line WL1 of transistors M11 and M12. Gate electrode 109-2 functions as word line WL2 of transistors M21 and M22. A sidewall oxide film 111 is formed at both sides of gate electrode layer 109-1, cap oxide film 110-1, gate electrode layer 109-2 and cap oxide film 110-2.

As shown in FIGS. 9 and 10, a diffused drain layer 112a and a diffused source layer 112b are formed in a self-aligned manner with sidewall oxide films 106 and 111, in proximity to the surface of silicon substrate 101 inside opening 151. These diffused layers are formed by diffusing an n-type impurity in silicon substrate 101 to form the regions for the drain and source of transistor M21. Though cross-sectional figures corresponding to FIG. 5 are not shown, transistors M11, M12 and M22 have the same structure as transistor M21.

An interlayer insulator 113 of a boron phosphorous silicate glass (BPSG) film and the like is formed over the entire surface to cover the devices described above. Contact holes 114b and 114c are formed, penetrating interlayer insulator 113 to reach diffused drain layer 112a and diffused source layer 112b inside opening 151. Metal wirings 115b and 115c, patterned in a linear manner, are formed to fill in the contact holes, extended to intersect at a right angle to gate electrode layers 109-1 and 109-2 (FIGS. 9 to 11). Metal wirings 115b functions as bit lines BL1 and BL2. Metal wirings 115c functions as source lines SL1 to SL4. The metal wirings are made of aluminum and the like.

As shown in FIG. 8, field shield gate electrode 104 is connected via contact holes 114a, to metal wiring 115a extended parallel to metal wirings 115b and 15c. Metal wiring 115a is normally fixed to 0V. As described below, it is a characteristic of the invention to apply a voltage of 2.5V, for example, to read data from a field shield transistor as a memory cell. Here, the threshold voltage of a field shield transistor for device isolation is, for example, 3V, wherein field shield gate electrode 104 is a gate electrode of field shield transistor for device isolation. Therefore, field shield gate electrode 104 is fixed to 0V to keep the field shield transistor for device isolation nonconducting to electrically isolate adjacent transistors M11 and M22 from each other.

Field shield transistor FS11 in FIG. 7 comprises a diffused source layer 112b in opening 151 coupled to source line SL1, a diffused source layer 112b in opening 152 coupled to source line SL3 and field shield gate electrode 104 and field shield gate oxide film 102 in between, as shown in FIGS. 8 and 13. Similarly, field shield transistor FS21 in FIG. 7 comprises a diffused source layer 112b in opening 151 coupled to source line SL2, a diffused source layer 112b in opening 152 coupled to source line SL4 and field shield gate electrode 104 and field shield gate oxide film 102 in between, as shown in FIGS. 8 and 14. A low concentration p-type impurity region 103 is formed in proximity to the surface of silicon substrate 101 (for the channel region) beneath field shield gate electrode 104 of field shield transistor FS11. A p$^-$ impurity region 103 represents stored data '1' (FIG. 13). On the other hand, p$^-$ impurity region 103 is not formed in proximity to the surface of silicon substrate 101 (for the channel region) beneath field shield gate electrode 104 of field shield transistor FS21, which indicates stored data '0' (FIG. 14).

Metal wirings 115a, 115b and 115c are covered with a protective film (not shown).

The function and operation of the mask ROM structured as above will now be described.

The mask ROM of the invention stores data not only in the memory cells (transistors M11 to M22), conventionally provided for data storage, but also in the field shield transistors, originally provided for device isolation. The method of data writing in and reading from the memory cells (transistors M11 to M22) will now be described.

Figure 4:
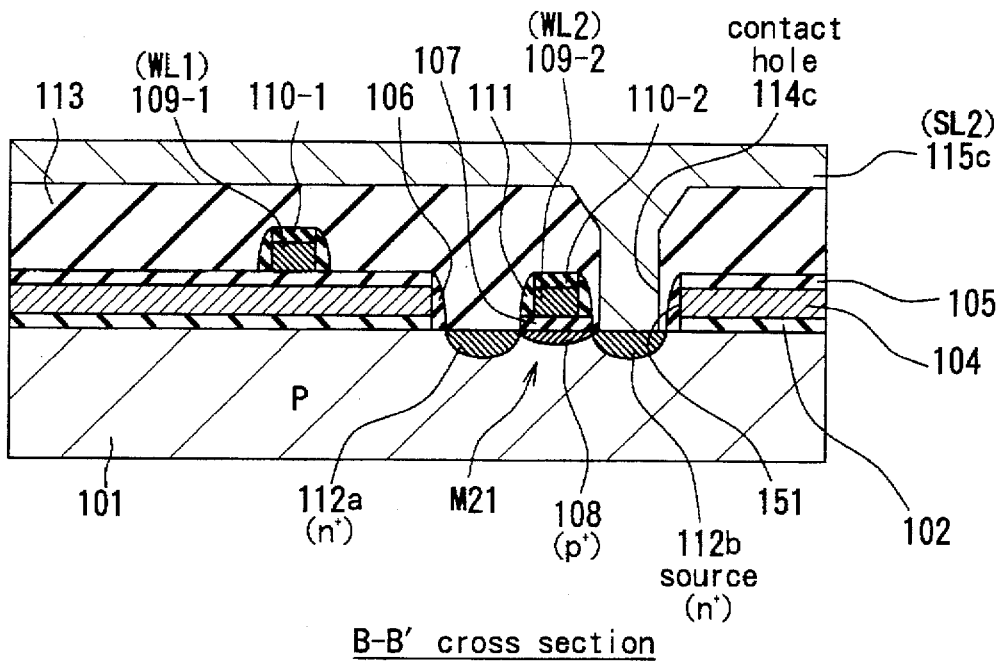
FIG. 4 is another cross section showing the device configuration of the memory cell array of FIG. 2.

The method of writing data in the memory cells (M11 to M22) of the mask ROM is the same as a conventional method. That is, data is written in the mask ROM during its manufacturing process by ion implantation of an impurity into the surface of silicon substrate 101 only in the region to be a channel region of a memory cell transistor with a masking except for that region, through which the threshold voltage of the memory cell transistor is changed. For instance, data is to be written into memory cell transistor M21 when the threshold voltage of transistors M11 to M22 is 1V in an initial state (when data is not written). During the manufacturing process, as shown in FIGS. 4 and 6, a high concentration p-type impurity region 108 is formed by ion implantation of a p-type impurity into silicon substrate 101 beneath gate electrode layer 109-2 of transistor M21 so as to change the threshold voltage to 2V only of transistor M21. The threshold voltage of the other transistors M11, M12 and M22 remains 1V. Data is thus written only in the memory cell comprising transistor M21.

The method of reading data from the memory cells (M11 to M22) of the mask ROM is the same as a conventional method, too. That is, data is read from the mask ROM manufactured as described above by judging data '0' or '1' corresponding to on/off of the memory cell to be read, or the presence or absence of a drain current, when the bit line of the memory cell transistor to be read is raised and a voltage is applied to the word line of the memory cell transistor. The applied voltage is the middle of a high threshold voltage (of the memory cell transistor wherein data is written) and a low threshold voltage (of the memory cell transistor wherein data is not written). To be specific, in FIG. 1, for example, bit line BL1 is set to 5V, bit line BL2 is set to 0V, word line WL1 is set to 1.5V and word line WL2 is set to 0V to read data from memory cell transistor M11 wherein data is not written. Source lines SL1 and SL2 are grounded to be 0V. In this case, the threshold voltage of transistor M11 is 1V so that transistor M11 turns on to allow a current to flow from bit line BL1 to source line SL1. On the other hand, to read data from memory cell transistor M21 wherein data is written, bit line BL1 is set to 5V, bit line BL2 to 0V, word line WL1 to 0V and word line WL2 to 1.5V. Source lines SL1 and SL2 are set to 0V as the case described above. Here, the threshold voltage of transistor M21 is 2V so that transistor M21 turns off not to allow a current to flow from bit line BL1 to source line SL2. The presence or absence of a drain current is thus judged, associated with data '0' or '1' to be read.

Memory cell transistors M11 to M22 are electrically isolated from each other to allow data reading from each of the memory cells as described above. The memory cells are isolated by fixing the field shield gate electrode 104 to 0V below the threshold voltage so as to keep the field shield transistor nonconducting.

The method of data writing and reading for the field shield transistor, the feature of the invention will now be described.

Data is written into the field shield transistor by lowering the concentration of the p-type impurity in proximity to the surface of silicon substrate 101 for the channel region of the field shield transistor wherein data is to be written. To be specific, to write data in field shield transistor FS11, low concentration p-type impurity region 103 is formed during the manufacturing process by ion implantation of an n-type impurity into the region in proximity to silicon substrate 101 beneath field shield gate electrode 104 of field shield transistor FS11, as shown in FIGS. 9, 10 and 13. The threshold voltage of field shield transistor FS11 is originally 3V to be lowered to 2V, for example. On the other hand, the threshold voltage of field shield transistor FS21 remains 3V. Data is thus written into field shield transistor FS11 only.

Data is read from the field shield transistor by judging data '1' or '0' corresponding to on/off of the field shield transistor to be read, or the presence or the absence of a drain current when one of the bit lines of the two memory cell transistors connected to the field shield transistor section to be read is raised. At the same time, the two memory cell transistors are turned on while two companion memory cell transistors to the two memory cell transistors are turned off, and all the source lines are kept floating and a voltage is applied to the gate electrode of the field shield transistor (the field shield line FSL). The applied voltage is the middle of a low threshold voltage (of 2V of the field shield transistor wherein data is written) and a high threshold voltage (of 3V of the field shield transistor wherein data is not written).

For example, to read data from field shield transistor FS11 in FIG. 13 wherein data is written, a voltage of 2.5V as the intermediate voltage is applied to the field shield line FSL while bit line BL1 is set to 5V, bit line BL2 to 0V, word line WL1 to 5V, word line WL2 to 0V, and source lines SL1 to SL4 are all kept floating. In this case, the threshold voltage of the memory cell transistors is 1V or 2V to turn on transistors M11 and M12 so that conduction occurs between bit line BL1 and FS11, and between bit line BL2 and FS11. At the same time, transistors M21 and M22 are turned off so that conduction does not occur between bit line BL1 and FS21, and between bit line BL2 and FS21. The threshold voltage of field shield transistor FS11 is 2V so that field shield transistor FS11 is turned on. As a result, a current flows from bit line BL1 to bit line BL2 via memory cell transistor M11, field shield transistor FS11 and memory cell transistor M12. It is thus judged that data '1' is read.

To read data from field shield transistor FS21 wherein data is not written, a voltage of 2.5V as the intermediate voltage is applied to field shield line FSL while bit line BL1 is set to 5V, bit line BL2 to 0V, word line WL1 to 0V, word line WL2 to 5V, and source lines SL1 to SL4 are all kept floating. In this case, the threshold voltage of memory cell transistors is 1V or 2V to turn on transistors M11 and M12 so that conduction occurs between bit line BL1 and FS21, and between bit line BL2 and FS21. At the same time, transistors M11 and M12 are turned off so that conduction does not occur between bit line BL1 and FS11 and between bit line BL2 and FS11. The threshold voltage of field shield transistor FS21 remains 3V so that field shield transistor FS21 does not turn on. Therefore, a current will not flow from bit line BL1 to bit line BL2. It is thus judged that data '0' is read.

A method of manufacturing the mask ROM structured as above will now be described, referring to FIGS. 15 and 16. FIGS. 15 and 16 show the manufacturing process for a cross section taken along line B-B' in FIG. 8.

Figure 15A:
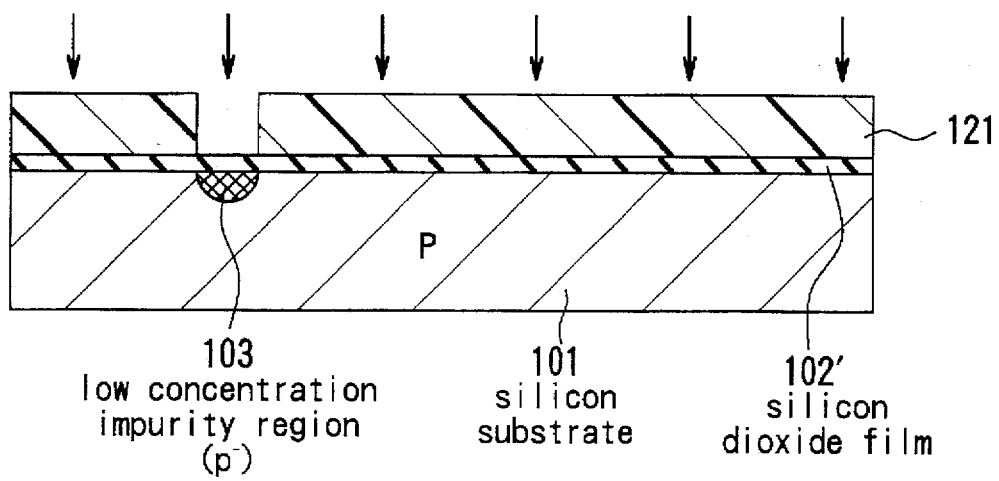
FIGS. 15A, 15B and 15C show manufacturing steps for describing a manufacturing method of the mask ROM in accordance with the invention.

First, as shown in FIG. 15A, a silicon dioxide film 102' with a thickness of approximately 100 to 200 nm is formed by thermal oxidation in p-type silicon substrate 101 with an impurity concentration of $(1 \text{ to } 5)*10^{16}$ cm$^{-3}$. A photoresist 121 is applied to coat the entire surface, patterned to provide an opening at a given position. An n-type impurity is doped in the proximity of the surface of silicon substrate 101 via the opening by ion implantation. Low concentration impurity region 103 where the concentration of p impurity is relatively low is thus formed. Here, the ion implantation is done with phosphorus (P), for example, wherein acceleration energy is in the range of 30 to 50 keV and the dose amount is $(1 \text{ to } 10)*10^{11}$ cm$^{-2}$. The reverse of this method is also possible, that is, ion implantation of p-type impurity with masking of the given position as described above only allows the region other than the masked position to be of high concentration. As a result, low concentration impurity region 103 is formed where the concentration of the p-type impurity is relatively low.

Figure 15B:
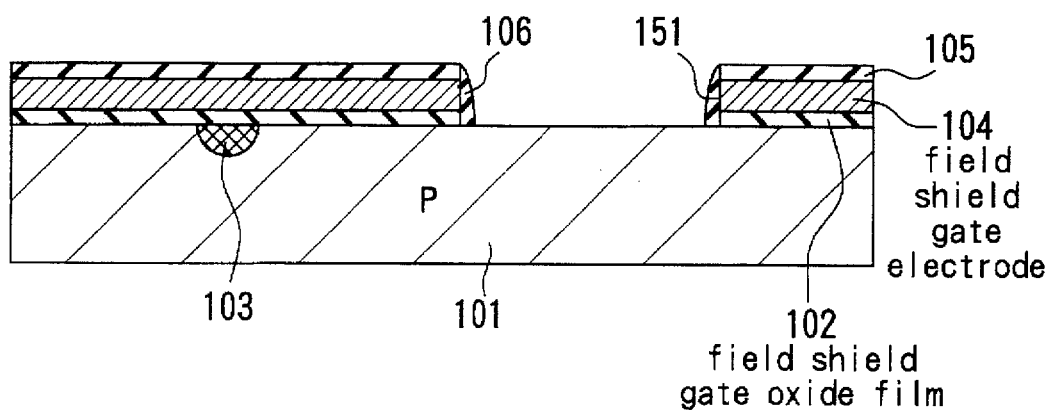

Next, as shown in FIG. 15B, photoresist 121 is removed to form a polysilicon film with a thickness of 150 to 200 nm wherein phosphorus is doped, by chemical vapor deposition (CVD). A silicon dioxide with a thickness of 100 to 200 nm is further formed. These layers are patterned to provide opening 151 so as to form field shield gate oxide film 102, field shield gate electrode 104 and field shield cap oxide film 105. Opening 152 is also formed at the same time. Sidewall oxide films 106 are also formed at the inner sides of opening 151 by forming a silicon dioxide film with a thickness of 150 to 200 nm by CVD to be etched by anisotropic etching.

Figure 15C:
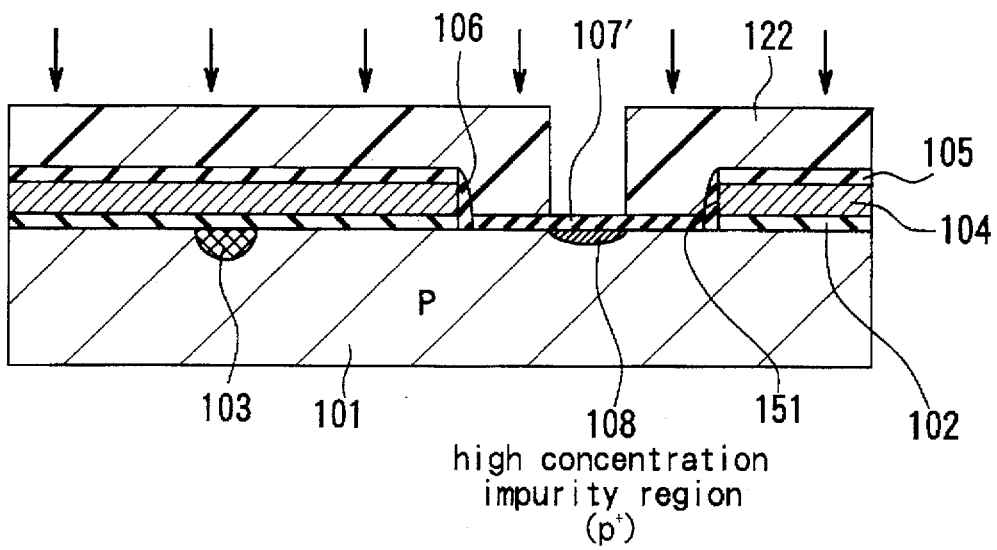

Next, as shown in FIG. 15C, a silicon dioxide film 107' with a thickness of 15 to 30 nm is formed over silicon substrate 101 inside opening 151. A photoresist 122 is applied to the entire surface, patterned to provide an opening in the center of opening 151. With this masking, a p-type impurity is introduced to the center of opening 151 by ion implantation, to form high concentration p-type impurity region 108. Here, the ion implantation is done with boron fluoride (BF$_2^+$) with acceleration energy of 20 to 50 keV and the dose amount is $(1 \text{ to } 10)* 10^{11}$cm$^{-2}$.

Figure 16A:
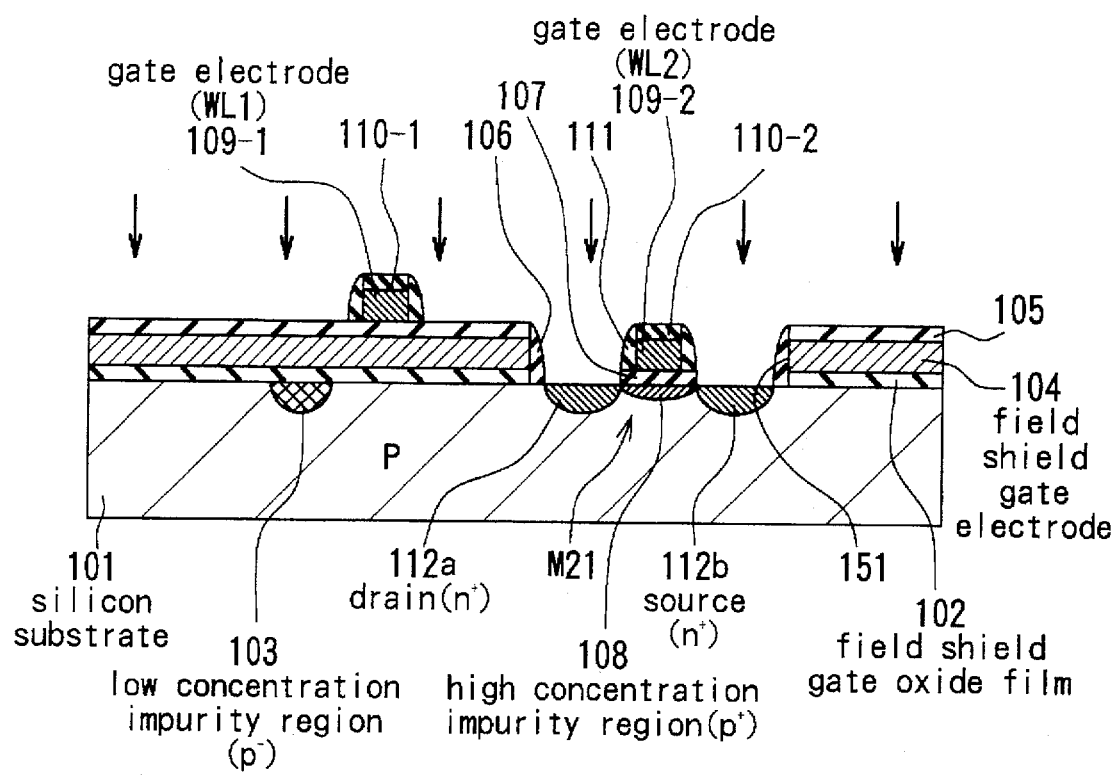
FIGS. 16A and 16B show manufacturing steps following the steps shown in FIGS. 15A, 15B and 15C.

Next, as shown in FIG. 16A, photoresist 122 is removed to form a polysilicon film with a thickness of 150 to 200 nm wherein phosphorus is doped, by CVD. A silicon dioxide film with a thickness of 100 to 200 nm is further formed by CVD. These films are patterned to provide gate oxide film 107, gate electrodes 109-1 and 109-2 and cap oxide films 110-1 and 110-2. Sidewall oxide films 111 are formed at both sides of the word line comprising gate oxide film 107, gate electrodes 109-1 and 109-2 and cap oxide films 110-1 and 110-2 by forming a silicon dioxide film with a thickness of 200 to 300 nm by CVD to be etched by anisotropic etching.

Figure 1:
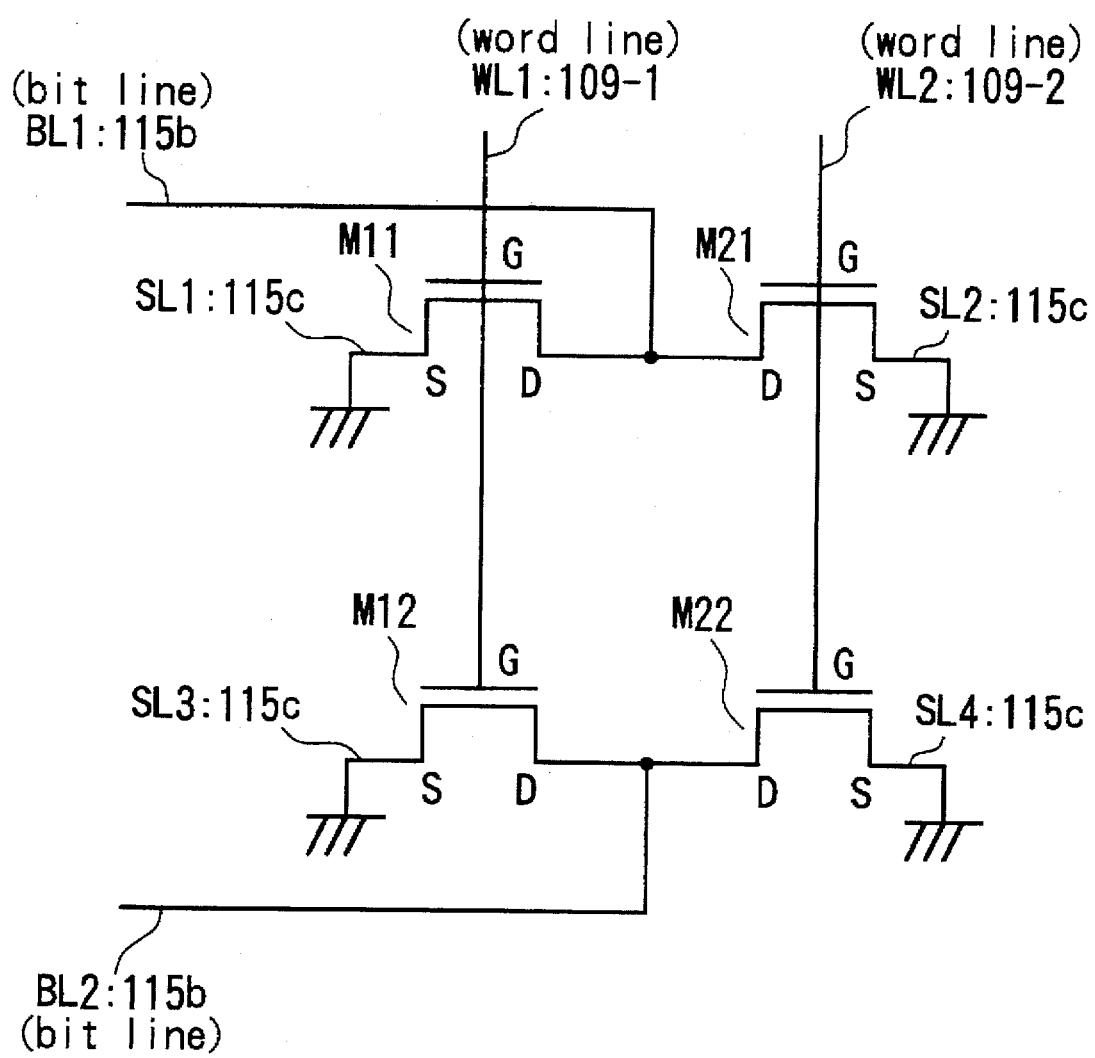
FIG. 1 is a circuit diagram showing part of a memory cell array of a conventional mask ROM.
Figure 2:
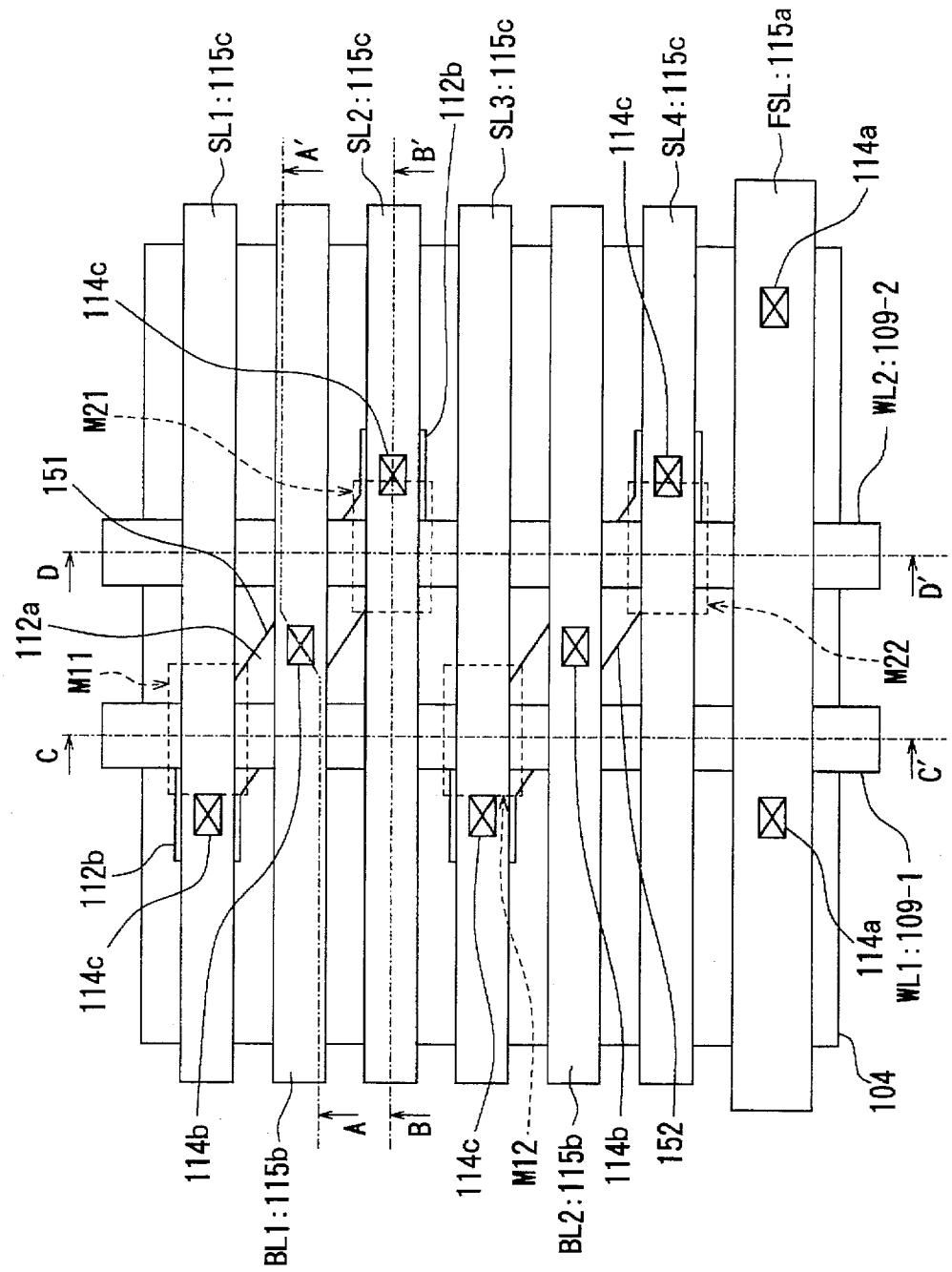
FIG. 2 is a plan view showing the device configuration of the memory cell array of the mask ROM of FIG. 1.
Figure 3:
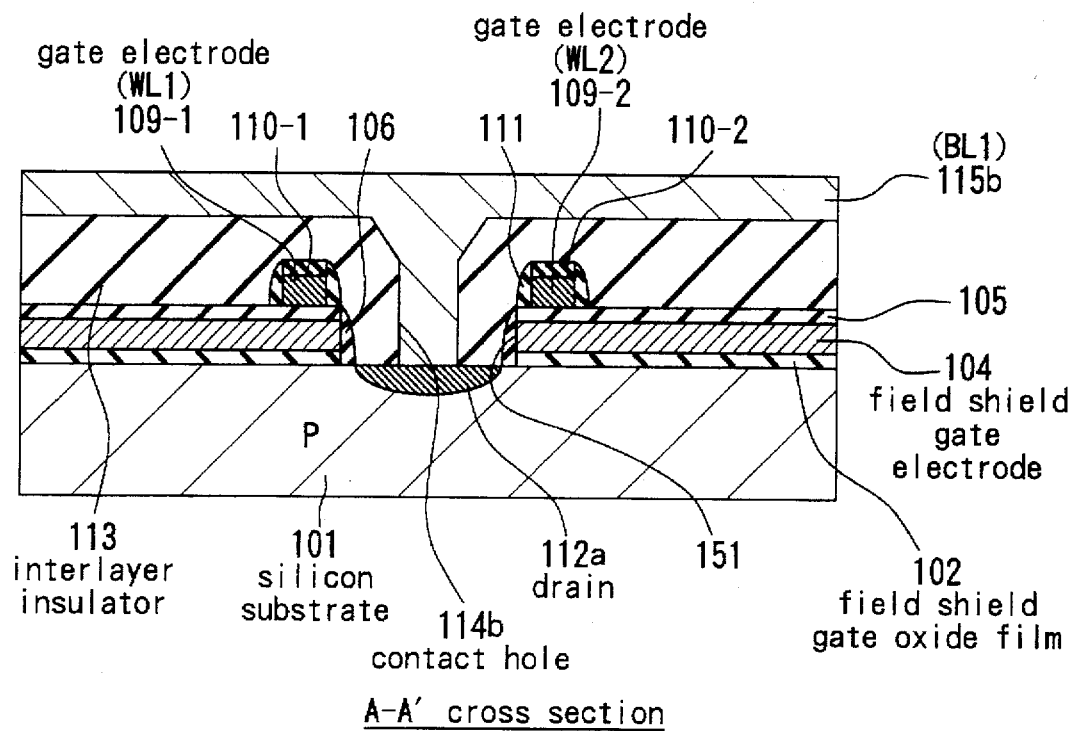
FIG. 3 is a cross section showing the device configuration of the memory cell array of FIG. 2.
Figure 16B:
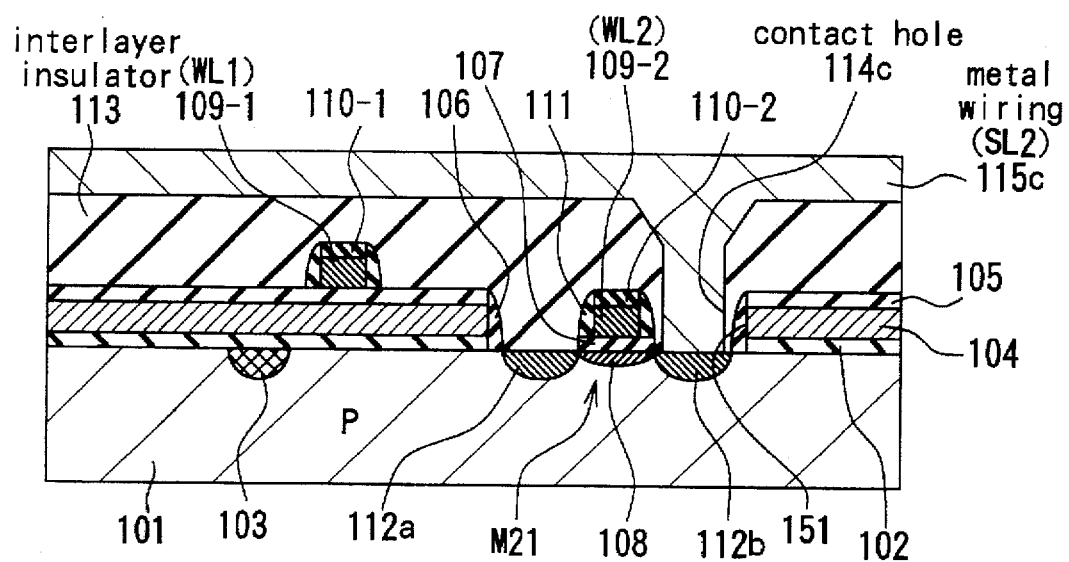

Next, as shown in FIG. 16B, diffused drain layer 112a and diffused source layer 112b are formed by ion implantation of an n-type impurity over the entire surface. This ion implantation uses arsenic (As$^+$) with acceleration energy in the range of 70 to 100 keV and the dose amount $(5 \text{ to } 10)*10^{15}$ cm$^{-2}$. An interlayer insulator 113 is then formed by CVD over the entire surface, of a BPSG film and the like with a thickness in the range of 500 to 800 nm. Contact holes 114, including contract hole 114c and contact holes 114a and 114b in FIGS. 2 and 3 are then formed. Metal wiring layers of aluminum, silicon and copper and so on, are formed by spattering with a thickness in the range of 500 to 800 nm to be patterned to form metal wirings 115a, 115b and 115c (as in FIGS. 8 to 10). A protection film (not shown) is then formed over the entire surface to complete the manufacture of the mask ROM.

The present invention is not limited to the method described above wherein ion implantation to the channel region is done over the silicon dioxide film 102° or 107' for controlling the threshold voltage of the field shield MOS transistor for device isolation and the memory cell transistors. This ion implantation may be done over the polysilicon film formed after each of those oxide films, with proper acceleration energy and the dose amount.

A memory cell array of 2*2 in FIGS. 7 and 8 used for a brief description. In practical applications, a memory cell array may be configured like the one shown in FIG. 17. The memory cell array comprises: word lines WL1 to WLm which are 'm' in number; bit lines BL1 to BLn which are 'n' in number; source lines SL1 to SL2n which are '2n' in number; memory cell transistors which are 'n'*'m' in number, each formed at each intersection of the word lines and the source lines; field shield transistors which are (n−1)*(m/2) in number, connecting odd-numbered source lines; field shield transistors which are (n−1)*(m/2) in number, connecting even-numbered source lines; and a field shield line FSL for applying a voltage required for field shield gate electrodes of the field shield transistors. Here, each of 'm' and 'n' represents an integer. Therefore, the memory bit capacity 'x' of the mask ROM is shown in the following equation (1).

$$X = n*m + (n-1)*(m/2)*2 \quad (1)$$
$$= 2*(n*m) - m$$

The result of the equation is approximately twice as much as the memory bit capacity (n*m) of a conventional mask ROM. That is, the present invention nearly doubles the memory capacity through using microstructuring techniques similar to conventional techniques.

Figure 17:
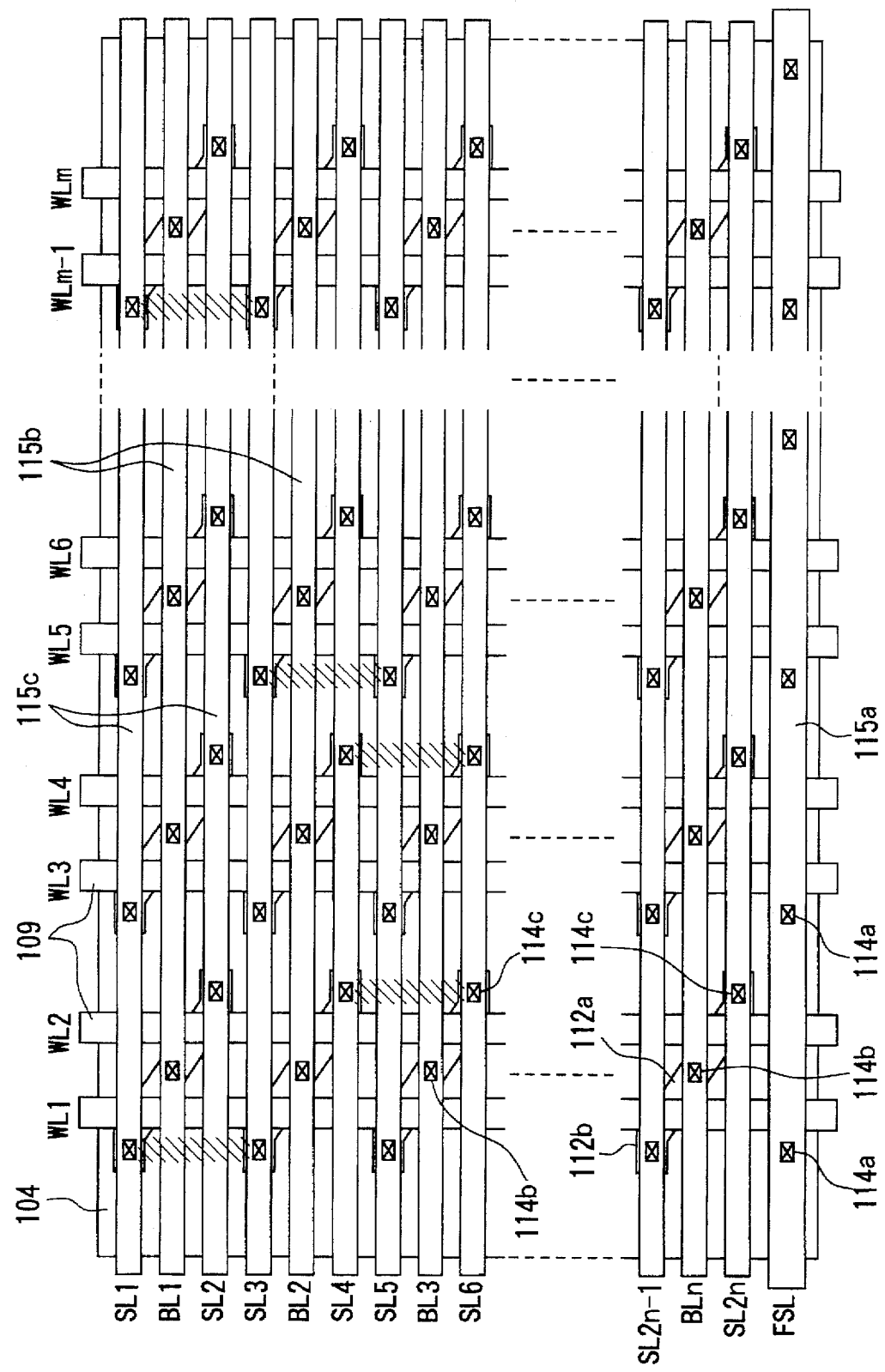
FIG. 17 is a plan view showing the device configuration of the memory cell array of the mask ROM for a practical application.
Figure 18:
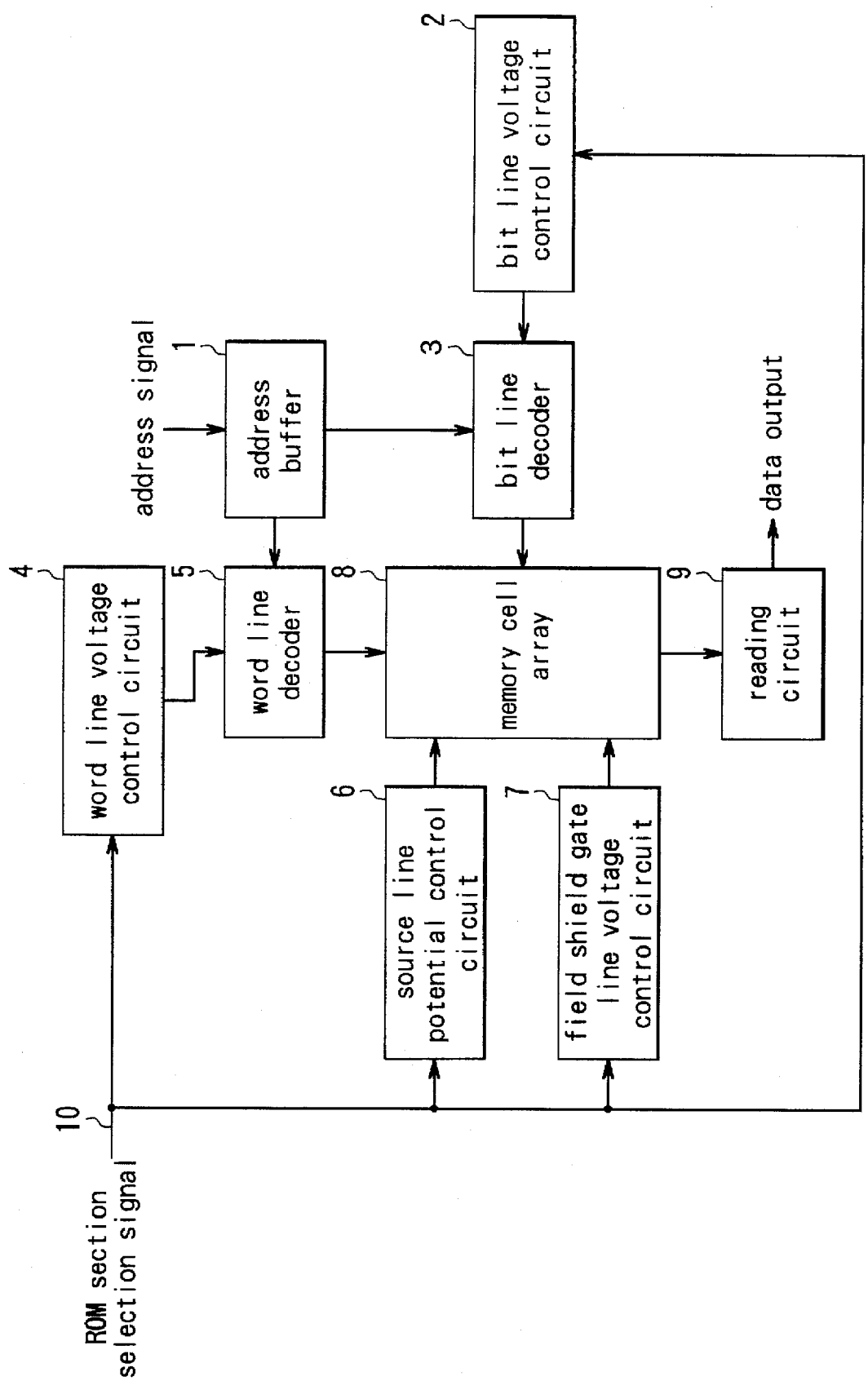
FIG. 18 is a block diagram showing the entire structure of the mask ROM of the invention including control circuits.

FIG. 18 shows the entire configuration of the mask ROM, including control circuits. The mask ROM comprises: a memory cell array 8 as shown in FIG. 17; an address buffer I wherein an address signal, indicating an address from which data is read, is inputted to be divided into a word address and a bit address to be outputted; a bit line voltage control circuit 2 controlling a voltage applied to bit lines BL1 to BLn; and a bit line decoder 3 decoding a bit address signal from the address buffer 1, to be inputted to the memory cell array 8, based on the bit line voltage control signal outputted from the bit line voltage control circuit 2. The mask ROM also comprises: a word line voltage control circuit 4 controlling a voltage applied to word lines WL1 to WLm; a word line decoder 5 decoding a word address signal from the address buffer 1, to be inputted to the memory cell array 8, based on the word line voltage control signal outputted from the word line voltage control circuit 4; a source line potential control circuit 6 controlling the potential of source lines SL1 to SL2n; a field shield gate line voltage control circuit 7 controlling a voltage applied to field shield gate line FSL of a field shield transistor and a reading circuit 9 reading data from the memory cell array 8 to be outputted. A ROM section selection signal 10 is inputted to the bit line voltage control circuit 2, the word line voltage control circuit 4, the source line potential control circuit 6 and the field shield gate line voltage control circuit 7.

In the mask ROM, ROM section selection signal 10 is inputted to activate the bit line voltage control circuit 2, the word line voltage control circuit 4, the source line potential control circuit 6 and the field shield gate line voltage control circuit 7. A voltage applied to each of the word lines, the bit lines and the source lines is appropriately controlled, depending on a word address and a bit address inputted from the address buffer 1. Data is thus read from a memory cell or a field shield transistor to be read in the memory cell array 8 to be outputted via the reading circuit 9.

In this embodiment of the invention, an n-type impurity is applied to the region where data is to be written, in the channel region of the field shield transistor, or a p impurity is applied to the region except for the region where data is to be written. The threshold voltage of the field shield transistor with that channel region is lowered for data writing. The reverse of this method is applicable, too, that is, a p impurity is applied to the region where data is to be written, or an n impurity is applied to the region except for the region where data is to be written. The threshold voltage of the field shield transistor with that channel region is raised for data writing. In this case, on/off (or the presence or the absence of a current) of the field shield transistor corresponds to data '0'/'1'.

The present invention is not limited to the foregoing embodiment but may be practiced in still other ways without departing from the characteristics thereof. The invention is not limited to memory cells and field shield transistors comprising NMOS transistors as described above, but may be applied to those using PMOS transistors.

The invention is not limited to the manufacturing method described above but any other manufacturing method is applicable that is capable of forming the structure of the mask ROM of the invention.

What is claimed is:

1. A mask ROM (read only memory) providing field shield device isolation, comprising:

MOS transistors for memory cells formed on a semiconductor substrate, storing data when a threshold voltage thereof is changed; and MOS field shield transistors for device isolation, separating each of said MOS transistors for memory cells from each other into electrically isolated divisions, wherein said MOS field shield transistors are formed in part of a device isolation region between said divisions and each functions as a memory cell by changing a threshold voltage of part of a channel region of said MOS field shield transistors for device isolation.

2. A mask ROM according to claim 1 wherein said part of the channel region is a region connecting a source or a drain of a MOS transistor for a memory cell in one division and a source or a drain of a MOS transistor for a memory cell in another division.

3. A mask ROM according to claim 2 further comprising:

a means for applying an intermediate voltage between different threshold voltages of said MOS field shield transistors for device isolation, to a field shield gate electrode of said MOS field shield transistor for device isolation;

a means for allowing said MOS transistor for a memory cell in one division as well as said MOS transistor for a memory cell in another division to be conducting;

a means for allowing both source lines of said conducting MOS transistors to be floating.

4. A method of reading data from a mask ROM according to claim 2 wherein:

selected source lines of MOS transistors for memory cells are kept floating;

a MOS transistor for a memory cell in one selected division and a MOS transistor for a memory cell in another selected division are kept conducting;

an intermediate voltage between different threshold voltages of said MOS field shield transistors for device isolation, is applied to a field shield gate electrode of said MOS field shield transistor for device isolation; and a current is detected flowing between the drain and the source of said MOS transistor for a memory cell in said one selected division, then between the drain and the source of said MOS field shield transistor whose field shield gate electrode is applied said intermediate voltage, and between the drain and the source of said MOS transistor for a memory cell in said another selected division.

5. A mask ROM providing field shield device isolation comprising a plurality of memory cell transistors formed on a semiconductor substrate storing data when a threshold voltage thereof is changed and a plurality of field shield transistors for providing device isolation separating each of said memory cell transistors from each other into electrically isolated divisions, wherein each field shield transistor has a channel region between adjacent divisions and each field shield transistor functions as a memory cell for storing data by changing a threshold voltage of part of said channel region.

6. A mask ROM according to claim 5 wherein said memory cell transistors and said field shield transistors are metal oxide semiconductor (MOS) transistors.

7. A mask ROM according to claim 6 wherein said part of the channel region is a region connecting a source or a drain of a memory cell MOS transistor in one division and a source or a drain of a memory cell MOS transistor in another division.

8. A mask ROM according to claim 7 further comprising:

a means for applying an intermediate voltage between different threshold voltages of said field shield transistors, to a field shield gate electrode of each of said field shield MOS transistors;

a means for allowing a memory cell MOS transistor in one division and a memory cell MOS transistor in another division to be conducting simultaneously; and a means for allowing both source lines of said conducting memory cell MOS transistors to be floating.

* * * * *